(12) United States Patent
Anzaki et al.

(10) Patent No.: US 6,419,800 B2
(45) Date of Patent: Jul. 16, 2002

(54) FILM-FORMING APPARATUS AND FILM-FORMING METHOD

(75) Inventors: Toshiaki Anzaki; Kenji Mori, both of Osaka-fu (JP)

(73) Assignee: Nippon Sheet Glass Co., Ltd., Osaku-fu (JP)

( * ) Notice: Subject to any disclaimer, the term of this patent is extended or adjusted under 35 U.S.C. 154(b) by 0 days.

(21) Appl. No.: 09/764,520

(22) Filed: Jan. 18, 2001

(30) Foreign Application Priority Data

Jan. 19, 2000 (JP) ........................................ 2000-010815

(51) Int. Cl.[7] ........................... C23C 14/35; C23C 14/34
(52) U.S. Cl. ........................... 204/192.12; 204/298.08; 204/298.17; 204/298.23; 204/298.28
(58) Field of Search .................. 204/192.12, 298.08, 204/298.17, 298.23, 298.28

(56) References Cited

U.S. PATENT DOCUMENTS

| | | | | |
|---|---|---|---|---|
| 4,981,566 A | * | 1/1991 | Wurczinger | 204/192.13 |
| 5,240,583 A | * | 8/1993 | Ahonen | 204/298.04 |
| 5,611,899 A | * | 3/1997 | Maass | 204/298.08 |
| 5,798,029 A | * | 8/1998 | Morita | 204/298.16 |

* cited by examiner

Primary Examiner—Steven H. Ver Steeg
(74) Attorney, Agent, or Firm—David G. Conlin; Steven M. Jensen; Edwards & Angell, LLP

(57) ABSTRACT

There may be used a film-forming apparatus having a substrate 4 that is rotatable around the center of one rotating axis 10 in the vertical direction situated in an inner cylinder 12, and a plurality (four in FIG. 2) of target units each comprising the pair of targets 2A, 2B (2B is under 2A serially arranged in the vertical direction inside an outer cylinder 13 opposite the surface 4a of the substrate 4, which are arranged in parallel in the circumferential direction of the inner wall of the outer cylinder 13. By employing a method whereby voltage is applied while alternatively reversing the polarity to each of the targets 2A, 2B, it is possible to form a coating on the surface of a substrate by glow discharge sputtering, to accomplish destaticizing while the sputtering can be carried out using a small in-line or bell jar apparatus with small space.

7 Claims, 12 Drawing Sheets

Fig.2
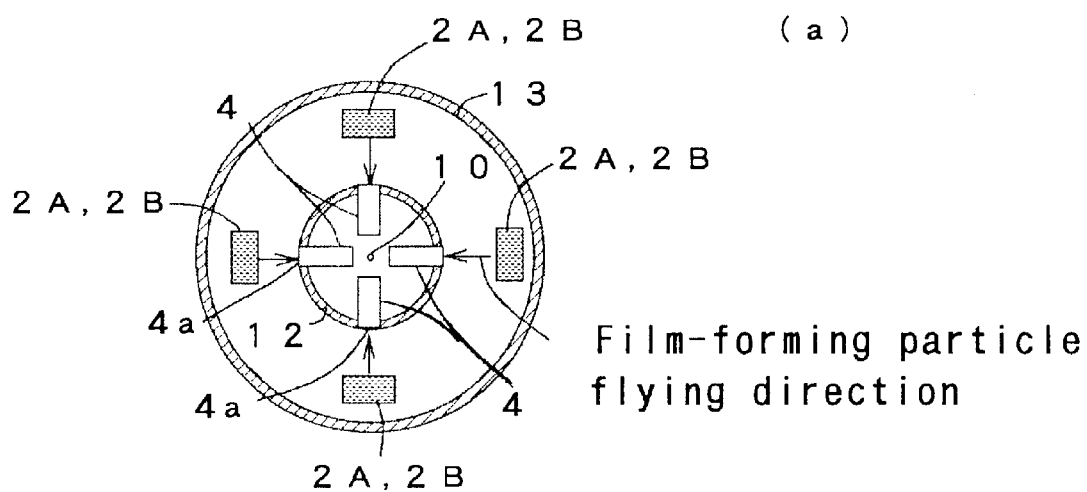
(a)
Film-forming particle flying direction
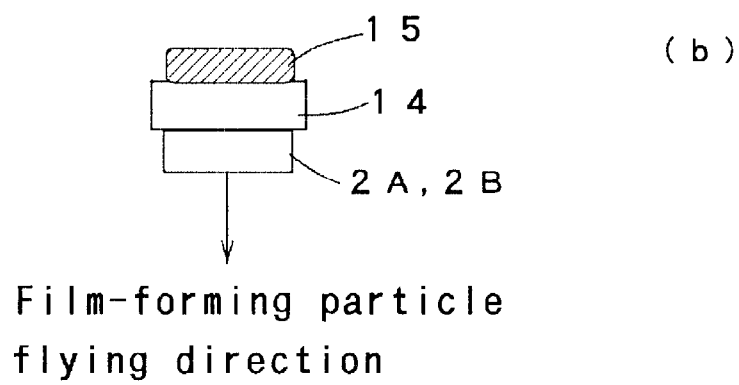
(b)
Film-forming particle flying direction Fig. 7
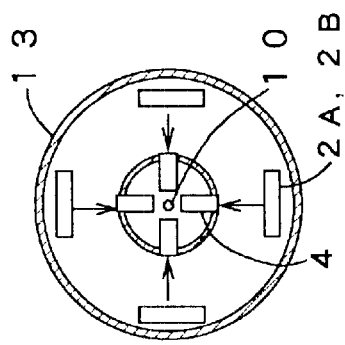
(b)
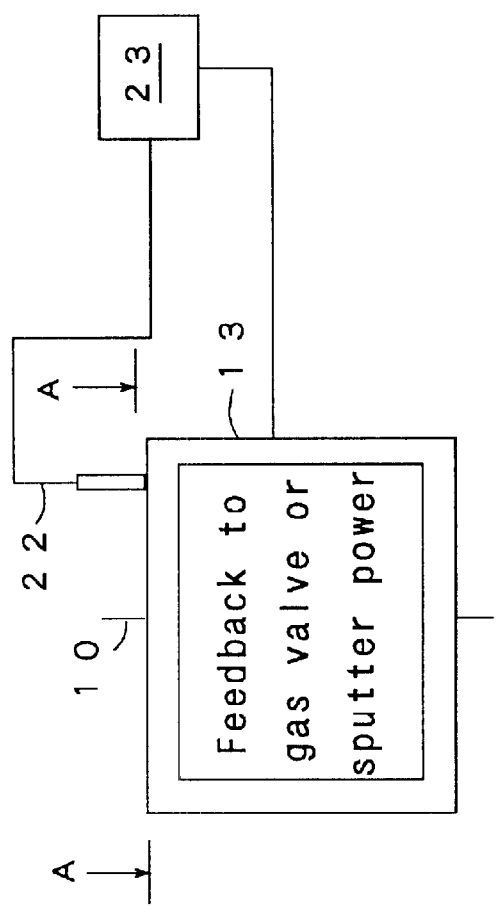
(a)

FILM-FORMING APPARATUS AND FILM-FORMING METHOD

FIELD OF THE INVENTION

The present invention relates to a film-forming apparatus that forms an optical film on optical members by sputtering in a vacuum apparatus with an adjustable reduced pressure atmosphere, to a method therefor and to film-formed substrates with films formed thereby.

DESCRIPTION OF THE PRIOR ART

It has been attempted in the past to place two sputtering targets adjacently on the same plane on respective cathodes, and coat the substrate with a coating comprising the components of the target material. In such cases, the method adopted is to provide each cathode with a power source for application of a negative voltage to the cathodes, i.e., to supply a negative voltage to each cathode with electrically separate systems.

This has been developed in recent years into an apparatus such as shown in FIG. 13, where alternately reversed voltages are applied to two targets on the same plane and a film is formed on a substrate while destaticizing the targets.

In the abbreviated cross-sectional view of a film-forming apparatus shown in FIG. 13, argon gas or, if necessary, oxygen, nitrogen, methane, alcohol, a hydrocarbon, fluorocarbon or other gas is introduced into the film-forming apparatus through a gas introduction tube (not shown), while the inside of the film-forming apparatus is simultaneously evacuated with an evacuation pump (not shown) to prepare a space reduced to a given pressure; when a negative voltage is applied from the power source 7 to the cathodes 1A, 1B arranged in a row, the glow discharge plasma 3 produced on the surface of the respective targets 2A, 2B situated on each cathode 1A, 1B accomplishes sputtering of the target 2A and the target 2B. When the cathode 1A is a positive electrode, the cathode 1B is a negative electrode. When the cathode 1A is a negative electrode, the cathode 1B is a positive electrode.

A gas retainer plate/anti-adhesion plate/film thickness control plate 6 is mounted surrounding the two cathodes 1A, 1B, and this prevents unnecessary flying of the sputtered particles while also closing off spread of the plasma 3 to stabilize the process. A substrate 4 on which the film is to be formed is situated at a position opposite the target 2A and target 2B outside the openings of the gas retainer plate/anti-adhesion plate/film thickness control plate 6. The substrate 4 is conveyed in the same direction as the direction in which the pair of targets 2A, 2B are oriented.

A magnetron power source 7 applies a negative voltage to the cathodes 1A and 1B. At this time, an oscillator, switching circuit or AC electric generator 8 alternately reverses the polarity of the cathodes 1A and 1B so that the cathode 1B is the positive electrode when the cathode 1A is the negative electrode and so that the cathode 1A is the positive electrode when the cathode 1B is the negative electrode, to destaticize the charge accumulated on the surface of the targets 2A, 2B, while from an instantaneous point of view, the alternating reverse glow discharge plasma 3 produced by applying a negative voltage to one of the cathodes 1A or 1B and a positive voltage to the other of the cathodes 1B or 1A causes sputtering of the targets 2A and 2B situated on the surfaces of the two cathodes 1A and 1B.

On the other hand, there are methods for forming films on the ends of optical three-dimensional parts by vacuum evaporation, whereby films can be coated on the ends or sides of numerous small optical (three-dimensional) parts, which uses the combined effect of rotating a dome loaded with the optical parts and using activating means such as a plasma assist.

Problems to be Solved by the Invention

There has been a limit to the number of optical parts that can be charged by the aforementioned optical part vacuum evaporation process, and productivity has not been very high.

In addition, there are also limits on the materials that can be used for conventional film formation by such vacuum evaporation, and in principle compounds comprising elements of different vacuum evaporation pressures have different vacuum evaporationization rates for each element, such that composition of the vacuum evaporation source has often differed from the composition of the film.

It is an object of the present invention to provide a film-forming method for fabrication of compact optical parts using a bell jar (or "carousel-shaped") apparatus whereby the number of parts that can be placed in the apparatus at a time can be increased, and to provide an apparatus therefor.

SUMMARY OF THE INVENTION

The aforementioned objects of the invention can be achieved by the following construction.

(1) A film-forming apparatus comprising a magnetron sputtering cathode, a target situated on the cathode and a film-forming substrate positioned opposite the target, in a vacuum apparatus with an adjustable reduced pressure atmosphere, the film-forming apparatus characterized by being provided with a pair of cathodes located proximally to each other and situated in a straight line in the direction perpendicular to the conveying direction of the substrate, with at least one row situated in the conveying direction of the substrate, and a power source device (a power source, an oscillator, switching circuit or AC electric generator etc.) that alternately reverses the polarity of the pair of cathodes so that when the first of the pair of cathodes is used as a negative electrode the second of the pair of cathodes is used as a positive electrode, and when the second of the pair of cathodes is used as a negative electrode the first of the pair of cathodes is used as a positive electrode, in order to apply a glow discharge-producing voltage to a pair of targets corresponding to each of the pair of cathodes, situated on the surface of each cathode.

(2) A film-forming method in which a magnetron sputtering cathode, a target situated on the cathode and a film-forming substrate positioned opposite the target, are situated in a vacuum apparatus with an adjustable reduced pressure atmosphere, to form a film on the surface of the substrate, the film-forming method being one which comprises situating a pair of cathodes located proximally to each other in a straight line in the direction perpendicular to the conveying direction of the substrate, with at least one row situated in the conveying direction of the substrate, alternately reversing the polarity of the pair of cathodes so that when the first of the pair of cathodes is used as a negative electrode the second of the pair of cathodes is used as a positive electrode, and when the second of the pair of cathodes is used as a negative electrode the first of the pair of cathodes is used as a positive electrode, in order to apply a glow discharge-producing voltage to a pair of targets corresponding to each of the pair of cathodes, situated on the surface of each cathode, and simultaneously sputtering the pair of targets by the produced glow discharge to form a film comprising the structural material of the targets on the surface of the substrate.

(3) A film-formed substrate characterized by being obtained by the film-forming method of (2) above.

It is preferred to provide an oscillator, switching circuit or AC electric generator between the power source and cathodes for alternate reversal of the polarity of the pair of cathodes. In the film-forming apparatus of the invention, as shown by the plan view of the surfaces of the targets 2A, 2B in FIG. 1, the pair of targets 2A, 2B are situated adjacent to each other and they are arranged serially in the direction perpendicular to the conveying direction, with at least one row situated in the conveying direction of the substrate 4.

The film-forming apparatus of the invention, in which the pair of targets 2A, 2B are situated adjacent to each other and they are arranged serially in the direction perpendicular to the conveying direction, with at least one row situated in the conveying direction of the substrate, alternately reverses the polarity of the cathodes 1A, 1B corresponding to the pair of targets 2A, 2B, so that the polarity of each of the targets 2A, 2B is alternately reversed when the voltage is applied; this method allows a coating to be formed on the surface of the substrate 4 by glow discharge sputtering, to accomplish destaticizing while the sputtering can be carried out using a small in-line or bell jar (or "carousel-shaped") apparatus with a small space.

In contrast, in the film-forming apparatus shown in FIG. 13, the targets 2A, 2B situated for the pair of cathodes 1A, 1B whose polarities are alternately reversed are oriented in the same direction as the conveying direction of the substrate 4 so that the film-forming apparatus requires a relatively large space.

As the bell jar apparatus mentioned above, seen in FIG. 2 (FIG. 2(a) shows a view of the bell jar apparatus in the horizontal cross-sectional direction, with the rotating axis in the vertical direction, and FIG. 2(b) shows an expanded side view of each target section of FIG. 2(a)), there may be used a film-forming apparatus having a substrate 4 that is rotatably situated around the center of one rotating axis 10 at the vertical direction in an inner cylinder 12, and a plurality (four in FIG. 2) of target units each comprising the pair of targets 2A, 2B (2B is under 2A and cannot be seen in FIG. 2) serially arranged in the vertical direction inside an outer cylinder 13 opposite the surface 4a of the substrate 4, which are arranged in parallel in the circumferential direction of the inner wall of the outer cylinder 13. FIG. 2(b) shows an expanded side view of the targets 2A, 2B, and a backing plate 14 and magnetron magnet 15 are situated behind the targets 2A, 2B.

The film-forming apparatus of the invention may also have the construction shown in FIG. 3 (FIG. 3(a) is a plan view of the targets 2A, 2B from the side of the magnets 15A, 15B on the backing plates 14A, 14B respectively and FIG. 3(b) is a side view of the targets 2A, 2B), wherein the magnetron magnet 15 on both of the backing plates 14A and 14B is situated so that the average magnetic force at the border section between the pair of targets 2A, 2B situated adjacent to each other is weaker than at the other sections, and so that the magnetic field at the erosion zones (the zones where sputtering is performed) on the targets 2A, 2B are equivalent at the sections near the border section and at the other sections. The method whereby the average magnetic force at the border section is rendered weaker than at the other sections may involve, for example, the use of a magnetron magnet 15 with a weaker magnetic force at the border section than at the other sections, or it may be achieved by constructing the magnetron magnet 15 at the border section with magnets 15 consisting of numerous small strips arranged in a row, and making adjustment by increasing or decreasing the spacing between the small strips of magnets 15.

The aforementioned film-forming apparatus may also have the construction shown in FIG. 4 (FIG. 4(a) is a plan view of the targets 2A, 2B from the side of the magnet 15 and FIG. 4(b) is a side view of the targets 2A, 2B), wherein magnetron magnets 15 forming a single continuous magnetic circuit may be arranged in the pair of targets 2A, 2B.

The construction may be such that the difference in the target film thickness in the direction perpendicular to the conveying direction of the substrate 4 obtained by the process of sputtering the entirety of the pair of targets 2A, 2B shown in FIGS. 2 to 4 is within a range of about ±20%, and preferably within a range of about ±10%, in the main film-forming region.

Providing the magnetron magnet 15 causes the electrons to be trapped within the magnetic field on the targets 2A, 2B, and therefore gas such as argon that is supplied to the apparatus is ionized to a high density and impacts with the targets 2A, 2B at a high acceleration. This greatly increases the sputtering efficiency.

As shown in FIG. 5 (FIG. 5(a) is a schematic drawing of a construction in which an optical monitor is mounted on a bell jar film-forming apparatus, and FIG. 5(b) is a view along arrow A—A of FIG. 5(a)), an optical detector 17 such as an optical film thickness meter utilizing a light interference effect or the like may be installed on the side wall of a bell jar film-forming apparatus 13, and the accumulated film thickness and film transmission spectrum may be measured during the actual formation of the film on the substrate 4 from the targets 2A, 2B. A film thickness monitor employing a crystal oscillator may also be used instead of an optical detector 17, in which case the output of the crystal oscillator may be fed back to the power source to stably control the film-forming speed.

Here, as shown in FIG. 5, the end of the optical system of the optical detector 17 is situated with its optical axis in the direction normal to the side wall of the cylinder of the bell jar film-forming apparatus 13 (the direction perpendicular to the rotating axis 10 of the film-forming apparatus 13).

The film thickness may be adjusted by controlling the power source voltage, etc. with a film formation controlling system 18 while measuring the accumulated film thickness and transmission spectrum in the film formed on the surface of the substrate 4 (detecting the transmission spectrum by installing the light source on the side opposite the accumulated film transmission spectrum detector).

As shown in FIG. 6 (FIG. 6(a) is a schematic view of an construction in which a crystal film thickness meter is mounted inside a bell jar film-forming apparatus and FIG. 6(b) is a view along arrow A—A of FIG. 6(a)), a crystal film thickness meter 20 utilizing the mass change effect is installed near the front of the targets (cathodes) 2A, 2B, the signal corresponding to the accumulation rate of the film during actual film formation on the substrate 4 is measured, the signal is sent to a film formation control system 21 and a signal for control of the power of the power source of the cathode to keep the film accumulation rate at the prescribed value is sent to the power source so that the prescribed film accumulation rate may be stably maintained; it is thus possible to stably obtain a constant film thickness if the conveying speed or rotating speed of the substrate 4 is constant.

As shown in FIG. 7 (FIG. 7(a) is a schematic view of a construction in which an optical detector for detection of plasma emission is mounted on a bell jar film-forming apparatus, and FIG. 7(b) is a view along arrow A—A of FIG. 7(a)), an optical detector 22 capable of detecting plasma emission during film formation is installed near the film-forming apparatus, and the construction may be such that the optical detector 22 with one or more plasma emission-detecting optical axes is situated in a plane parallel to the surface of the targets 2A, 2B so that the reaction rate between the reactive gas and the flying particles from the targets 2A, 2B is controlled to the desired stable value.

Thus, the construction may be such that the intensity of the detected plasma emission is transmitted to the film-forming control system 23, and each of the targets 2A, 2B is provided with one or more systems with a mechanism that sends a control signal, based on the difference between this intensity and the value previously given by the user to the film-forming control system 23 which is necessary to maintain the two in a fixed relationship, from the film-forming control system 23 to a process gas flow control valve with a piezo-movable mechanism.

A film may also be formed at a low film-forming speed and high stability in reactive mode, without using plasma control. For this purpose it is preferably carried out in the reactive region of the hysteresis graph of the voltage plotted against the oxygen flow ratio.

By providing the film-forming apparatuses and film formation control systems 18, 21, 23 shown in FIGS. 5 to 7 above, it is possible to realize rapid, stable and precise coating of optical films on microparts, for example.

When a bell jar film-forming apparatus such as shown in FIG. 5 to FIG. 7 is used, the number of optical parts that can be placed in the apparatus at a time can be increased, and the space for management of the non-film-formed sections such as optical fibers can be provided inside the bell jar.

According to the invention, the material for the targets may be of a single type, and as target materials there may be used metals and inorganic elements composed mainly of conductive materials such as Al, Si, Ti, Nb, Zn, Sn, Zr, In, Bi, Ta, V, Cr, Fe, Ni, Ce and C, as well as their alloys and suboxides. Oxides or nitrides of these target materials can be accumulated onto the substrate 4 in one or more layers by reactive sputtering using oxygen or nitrogen.

Experimentally, C targets have been used by mixing an organic carbon compound gas such as methane with argon or the like and introducing them for plasma conversion to stably obtain diamond-like carbon films or carbon hydride films at low temperature and with high density and hardness. This has allowed stable coating of dense dielectric materials or protective film materials at a rapid speed.

Moreover, oxides of the aforementioned metals and inorganic substances composed mainly of Al, Si, Ti, Nb, Zn, Sn, Zr, In, Bi, Ta, V, Cr, Fe, Ni, Ce and C, or compound oxides or nitrides of a plurality of these metals may be used as target materials, and targets whose surface resistance is no greater than surface resistance 1 K-ohm can be accumulated on the substrate 4 to one or more layers by sputtering carried out using mainly argon. This method allows dielectric materials to be stably coated from ceramic targets.

Furthermore, when target layers are made with two or more different target materials and either one of these layers is obtained by the composition containing at least one type of metal of either In or Sn as an antistatic layer, it is possible to accumulate the In or Sn oxides by sputtering and thus rapidly and stably produce a coating with conductive and antistatic functions.

In addition, when target layers are made with two or more different target materials and either one of these layers is obtained by the composition containing at least one type of metal of Ti, Nb and Al as an antifouling layer, it is possible to accumulate the corresponding oxides of Ti, Nb and/or Al oxides by sputtering and thus form an optical multi-layer film with an antifouling effect due to a photocatalytic effect. For titania in particular, substances with an anatase crystal structure exhibit highly effective catalytic action.

The substrate for the invention may be a direct combination of a special substrate such as a rod lens, micro lens array, optical fiber or the like with an anti-reflection film or interference filter film formed by rapid and low-temperature sputtering having high activity, to increase its value as an optical part and thus lower production costs.

According to the present invention it is possible to obtain compact films and thus realize optical precision needed for optical parts that require precise standards.

DESCRIPTION OF THE DRAWINGS

FIG. 2 shows a view of a bell jar apparatus according to an embodiment of the invention from the horizontal cross-sectional direction (FIG. 2(a)), and an expanded side view of each target section of FIG. 2(a) (FIG. 2(b)).

FIG. 7(a) is a schematic view of a construction in which an optical detector for detection of plasma emission is mounted on a bell jar film-forming apparatus, and FIG. 7(b) is a view along arrow A-A of FIG. 7(a).

DESCRIPTION OF THE PREFERRED EMBODIMENTS

Embodiments of the present invention will now be explained with reference to the attached drawings.

Figure 12:
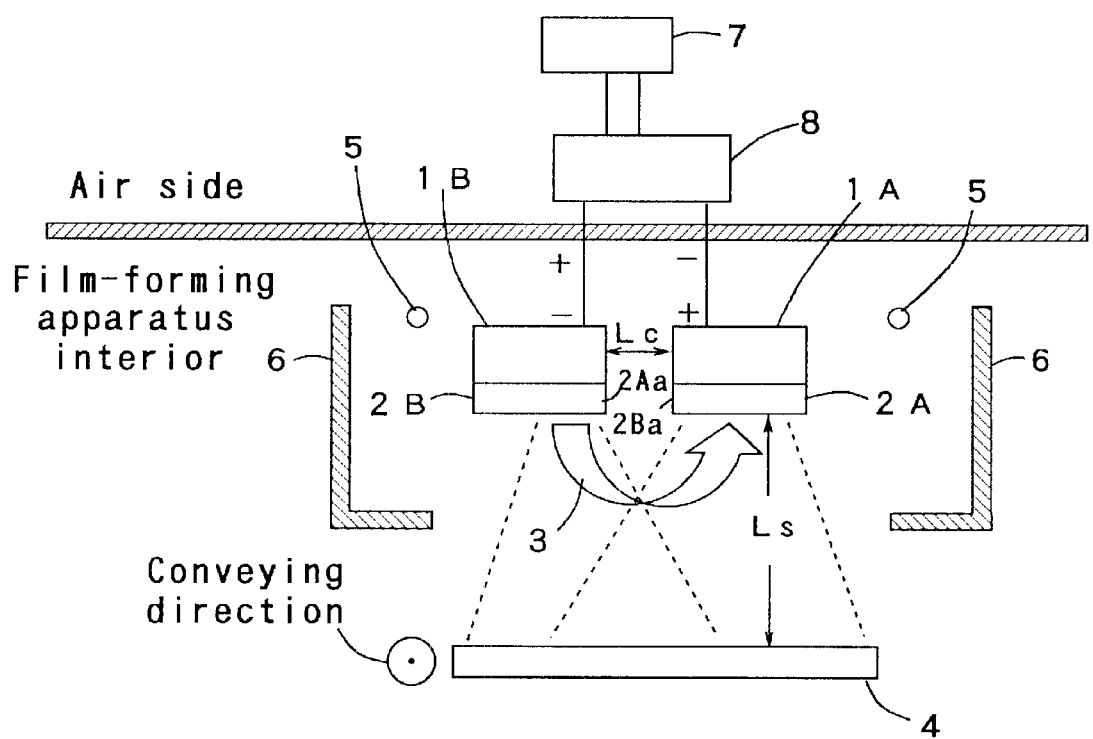
FIG. 12 is an abbreviated cross-sectional view of a sputtering film-forming apparatus that can be used to carry out the coating method for a film according to an embodiment of the invention.

FIG. 12 is cross-sectional view of a main part of an embodiment of a sputtering film-forming apparatus that can be used to carried out the coating method for a film according to the invention.

Argon gas, or if necessary a gas such as oxygen, nitrogen, methane, an alcohol, a hydrocarbon, a fluorocarbon or the like, is introduced into the film-forming apparatus through a gas introduction tube 5, and the film-forming apparatus is simultaneously evacuated with an evacuation pump (not shown), to prepare an atmospheric space reduced to a given pressure. The atmosphere of the reduced pressure space is adjusted with a vacuum evacuating pump, an introduced gas valve and a pressure-adjusting valve to allow sputtering of that gas composition at that pressure.

When a negative voltage is applied to the cathodes 1A, 1B from the power source 7, the glow discharge plasma 3 produced on the surface of the targets 2A, 2B accomplishes sputtering of the target 2A and the target 2B. When the cathode 1A is a positive electrode, the cathode 1B is the negative electrode. When the cathode 1A is the negative electrode, the cathode 1B is the positive electrode.

Since the target 2A is electrically connected to the cathode 1A and the target 2B to the cathode 1B, the polarities of the cathode 1A and target 2A and the polarities of the cathode 1B and target 2B are the same.

The voltage may be applied to the cathodes 1A, 1B by using a sine wave, pulse wave or time asymmetrical wave. Waveforms suitable for optional Fourier development may also be used. A DC bias with the same polarity for the two cathodes 1A, 1B may also be used simultaneously. The ordinary chamber earth potential and the standard zero potential of the waveform are floating and are unrelated potentials. Even if a potential difference exists between the chamber earth potential and the standard zero potential, it will be about 0–100 V.

A gas retainer plate/anti-adhesion plate/film thickness control plate 6 will be mounted surrounding the two cathodes 1A, 1B in some cases. This prevents unnecessary flying of the sputtered particles while also closing off spread of the plasma 3 to stabilize the process.

A substrate 4 on which the film is to be formed is situated at a position opposite the target 2A and target 2B outside the openings of the gas retainer plate/anti-adhesion plate/film thickness control plate 6.

Figure 13:
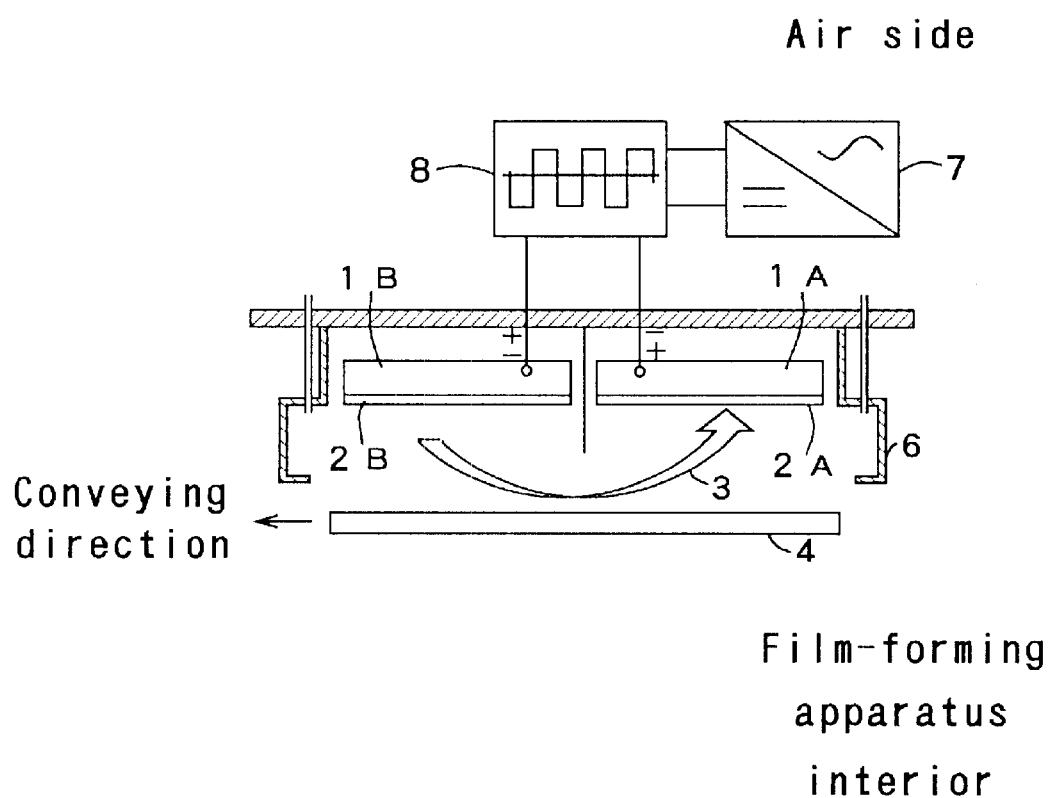
FIG. 13 is a schematic view of an apparatus for film formation on a substrate while destaticizing the targets, wherein a reverse voltage is alternately applied to each of two targets on the same plane.

In the film-forming apparatus of this embodiment of the invention shown in FIG. 12, the substrate 4 is conveyed in the direction vertical to the paper surface, unlike in the conventional film-forming apparatus shown in FIG. 13, and this construction is a major feature of the invention.

Alumina or a ceramic material such as silica or aluminum nitride is sometimes provided on the sides 2Aa, 2Ba of the targets 2A, 2B, so that a sheath produced by electrolysis is embedded therein. This can prevent arcing even on the sides 2Aa, 2Ba which are resistant to destaticizing.

The power source 7 alternately reverses the polarity of the cathodes 1A, 1B so that when the cathode 1A is the negative electrode the cathode 1B is the positive electrode and when the cathode 1B is the negative electrode the cathode 1A is the positive electrode, to destaticize the charge accumulated on the surface of the targets 2A, 2B, while from an instantaneous point of view, the alternating reverse glow discharge plasma 3 produced by applying a negative voltage to one of the cathodes 1A or 1B and a positive voltage to the other of the cathodes 1B or 1A causes sputtering of the targets 2A and 2B situated on the surfaces of the two cathodes 1A and 1B.

Here, an oscillator, switching circuit or AC electric generator 8 alternately reverses the polarity of the cathodes 1A and 1B.

The reversal frequency for reversal of the polarity is preferably at least 100 Hz, and more preferably at least 1 kHz. If it is lower than 100 Hz the destaticizing effect of electrification which charges the surface of the targets 2A, 2B is reduced, thus undesirably destabilizing the discharge. The reversal frequency is preferably no greater than 1 MHz, and more preferably no greater than 100 kHz. This is because if the reversal frequency exceeds 1 MHz, a kinetic delay of positive ions is produced with respect to the voltage oscillation, making it more difficult to achieve a destaticizing effect.

The waveform of the applied voltage may be an applied voltage waveform with a positive/negative balance in which the charge of the surface of the two targets 2A, 2B with respect to the time axis is neutral, such as a sine wave, rectangular pulse wave or time asymmetrical wave.

According to the invention, the polarities of the cathodes 1A, 1B are alternated by the aforementioned preferred reversal frequency to accomplish cathodal sputtering which on a micro scale is intermittent to the targets 2A, 2B, but by selecting the polarity reversal period within the aforementioned preferred range, in terms of the macroscopic viewpoint of forming a coating on the surface of the substrate 4, the target 2A and target 2B appear to be sputtered simultaneously and the film is thus adhered onto the surface of the substrate 4.

According to the invention, the charge on the surface of both targets 2A, 2B is neutralized by the reverse potential and reverse current, so that sputtering is accomplished while destaticizing. Consequently, there is no occurrence of abnormal discharge (arcing, corona, etc.) originating from heat shock or the like when the charge built up on the surface of the film accumulated on the surface of both targets 2A, 2B causes dielectric breakdown in the film.

Furthermore, a film coating is formed while removing the film accumulated on the surfaces of the erosion zones of the targets 2A, 2B cleaned by the cleaning effect produced by sputtering of the surface of both targets 2A, 2B by the glow discharge plasma 3. Consequently, accumulation of the electrically insulating coating on the surfaces of the erosion zones of both targets 2A, 2B is inhibited, and there is no "anodal loss phenomenon" normally seen when using a single target to coat an oxide film, so that the glow discharge plasma 3 is not interrupted during the coating.

A reactive gas may also be used as the sputtering gas, and in some cases the substrate 4 may be heated to form a different film from the target composition or to form a dense film. Such processes are selected with consideration of the distance Lc between the cathodes 1A, 1B, the minimum distance Ls between the substrate 4 and the targets 2A, 2B or if necessary, the rotating speed of the substrate 4, the sputtering rate, etc.

According to the invention, a gas such as nitrogen or oxygen is used for the process and is converted to plasma to accomplish reactive sputtering to allow formation of an oxides or nitride film.

The invention can also be carried out by using a material with a very low sputtering rate such as titanium (Ti) or stainless steel (SUS) for the targets 2A, 2B, or by using active carbon (C) as the target, introducing thereinto an organic carbon compound gas such as methane or an alcohol for conversion to plasma, and treating the substrate 4 by heating or the like to form a DLC (diamond-like carbon) or diamond microcrystalline aggregate film on the surface of the substrate 4; this form of application is known as plasma CVD or plasma PVD. Such processes are superior in that discharge can be stably maintained by the destaticizing effect even with introduction of the high density current which is the feature of the process of the invention, or even with accumulation of a dielectric film around the targets 2A, 2B, and it is thereby possible to increase the plasma energy density near the surface of the substrate 4 to easily and rapidly coat the substrate 4 with the aforementioned DLC film in a satisfactory manner at a relatively low temperature.

This is also effective as a hard coat on a plastic substrate or glass substrate comprising a single panel.

Figure 1:
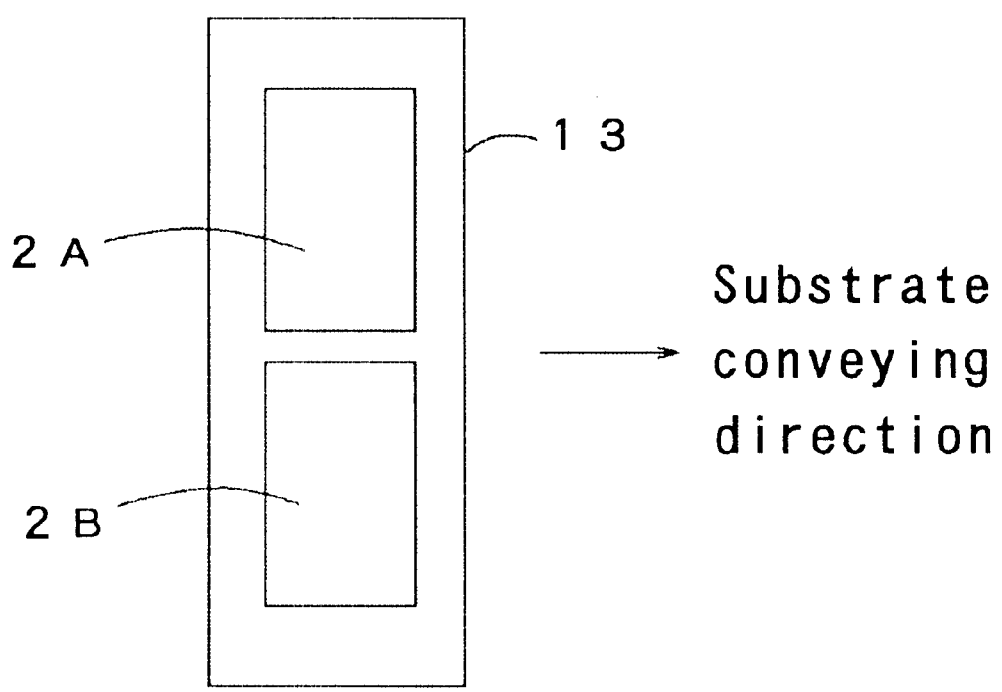
FIG. 1 is a plan view of the surface of a target according to an embodiment of the invention.
Figure 3:
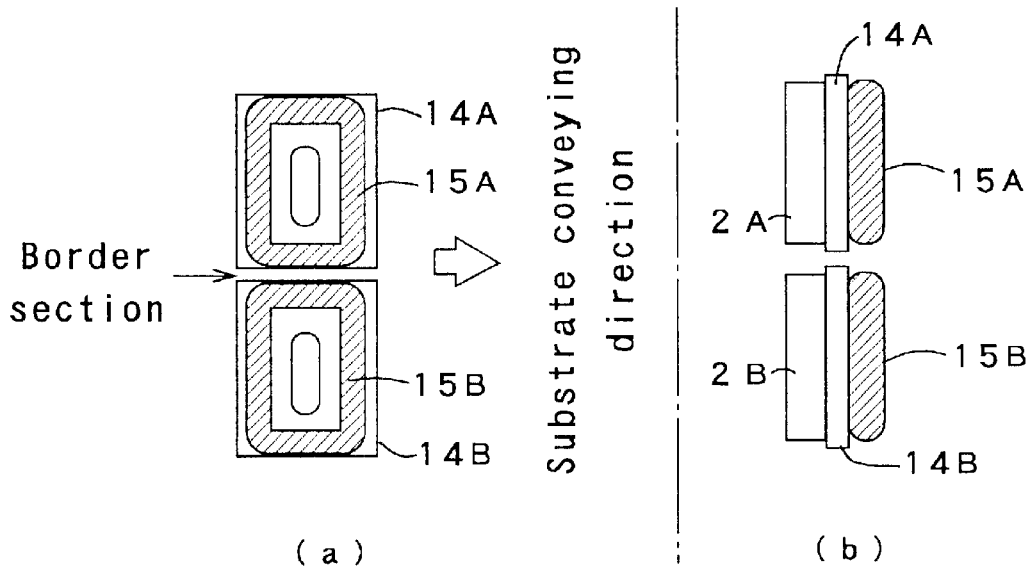
FIG. 3(a) is a plan view of targets and FIG. 3(b) is a side view of targets.
Figure 4:
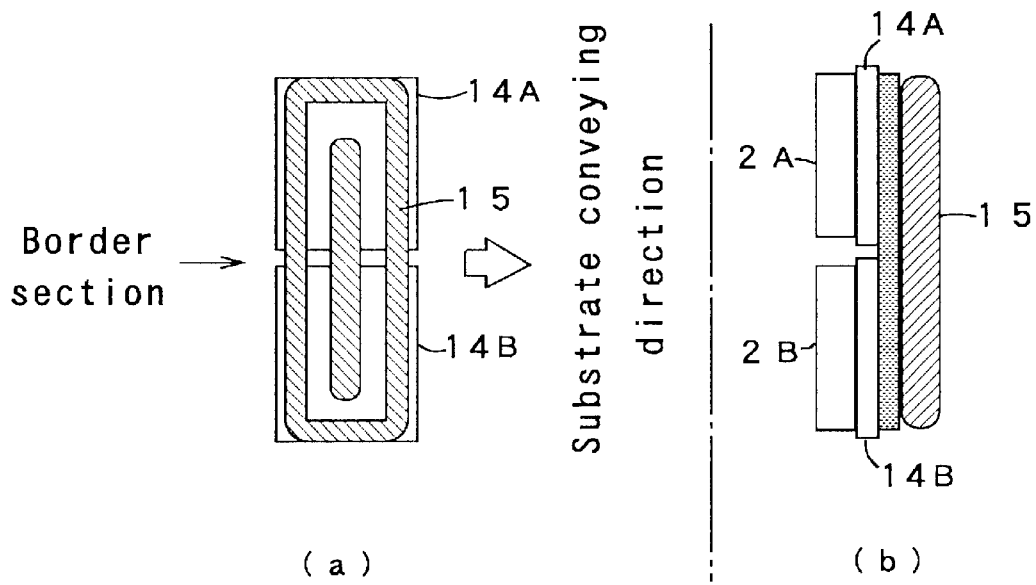
FIG. 4(a) is a plan view of targets and FIG. 4(b) is a side view of targets.
Figure 5:
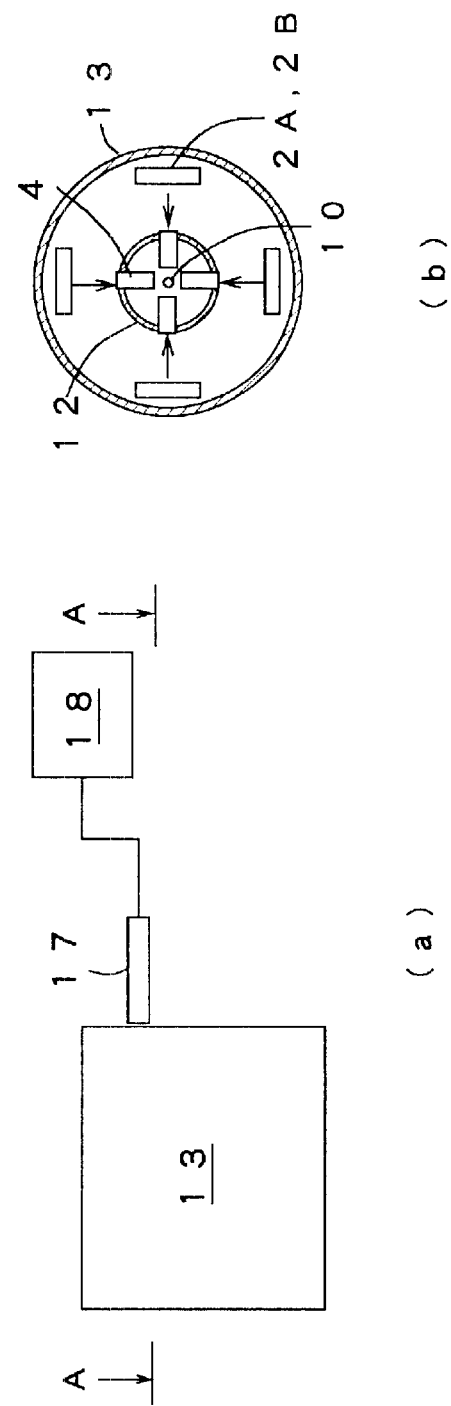
FIG. 5(a) is a schematic drawing of a construction in which an optical monitor is mounted on a bell jar film-forming apparatus.
FIG. 5(b) is a view along arrow A-A of FIG. 5(a).
Figure 6:
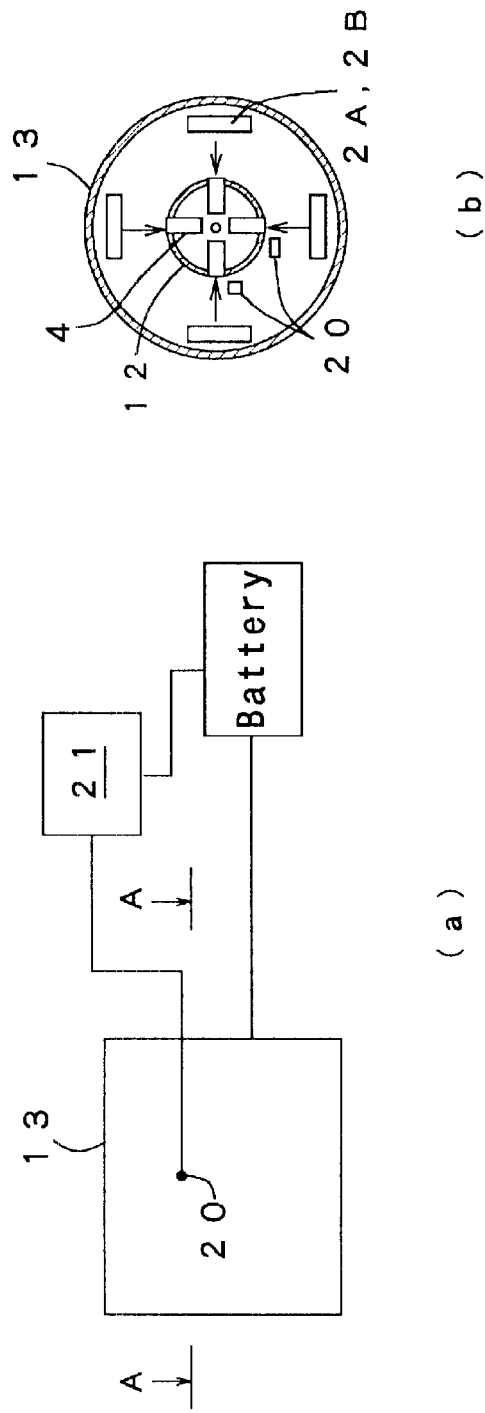
FIG. 6(a) is a schematic view of an construction in which a crystal film thickness meter is mounted inside a bell jar film-forming apparatus and FIG. 6(b) is a view along arrow A-A of FIG. 6(a).

On the back sides of these targets 2A, 2B (the opposite side from the substrate 4, centered around the targets 2A, 2B) there are provided, either integrated with or separately from the targets 2A, 2B, a backing plate 14 normally composed mainly of copper (FIG. 2, FIG. 3) used for voltage application and cooling, a cooling mechanism to cool it, and a reinforcing magnet 15 (FIG. 2, FIG. 3) to construct the magnetron. In order to increase adhesive property at the interface between the targets 2A, 2B and the backing plate 14, the surface of the backing plate usually formed of copper or the like is sometimes coated with a plating of nickel (Ni) or indium (In).

Sputtering target materials that may be used for the invention include metals, metal oxides, metal sulfides and metal nitrides. For example, there may be used metals or semiconducting elements of third to seventh Period and Groups 2A to 6B of the Periodic Table, such as indium, tin, zinc, gallium, antimony, aluminum, bismuth, titanium, zirconium, tantalum, niobium, molybdenum, cerium, silicon, lanthanum, etc. Conductive elements are preferred, and the targets 2A, 2B preferably have a surface resistance of no greater than 1 K-ohm/square to allow stabilized discharge. For example, in the case of silicon (Si), a trace amount of boron (B), aluminum (Al) or phosphorus (P) may be introduced to achieve conductivity.

A target material of any of the aforementioned metals of the Periodic Table (including semiconducting elements) may be used to form a metal oxide film, metal oxynitride film or metal nitride film on the substrate 4 by reactive sputtering. When a metal oxide or the like is used for the targets 2A, 2B, the targets are preferably sintered, in which case the targets 2A, 2B preferably have the aforementioned conductivity.

The technique of the invention can also be applied to formation of metal films and semiconductor films using the aforementioned metals and semiconducting elements of the Periodic Table. These metal oxides, sulfides and nitrides may be used as the targets 2A, 2B. In such cases, it is preferred to introduce a small amount of an impurity with an element of one Group higher (an element with a different coordination number) such as $TiO_2$—$Nb_2O_5$, for example, into the aforementioned elements of the Periodic Table, which is similar to the relationship between indium (In) and tin (Sn) in ITO, in order to improve the conductivity of the target surface. This can stably produce a current-bearing carrier in the targets 2A, 2B, thus creating a sputtering target with a stabilized discharge.

An example whereby the invention may be carried out using a sputtering film-forming apparatus with two mutually opposing planar-type magnetron cathodes 1A, 1B as shown in FIG. 12 will be explained below. The film coating conditions employed are those outlined below.

Distance Lc between two targets 2A, 2B: Normally adjustable.

Sputtering gas: When a metal oxide film is to be coated using a metal oxide for the targets 2A, 2B, argon alone or containing a small amount of oxygen is used as the sputtering gas. When a metal oxide film or metal nitride film is to be coated using a metal for the targets 2A, 2B, argon containing a reactive gas such as oxygen or nitrogen is used as the sputtering gas.

Sputtering pressure: Preferably 0.5–50 mTorr.

Substrate temperature: Preferably room temperature to 500° C.

Alternating reversal frequency: preferably 1–100 kHz.

Voltage amplitude between cathodes: Depends on the material, but preferably 200–3000 V.

Tables 1 to 3 show the results for Examples 1–7 and Comparative Examples 1–4 under the conditions described above.

TABLE 1

|  | Example 1 | Example 2 | Example 3 | Example 4 |
| --- | --- | --- | --- | --- |
| Cathode material | 2-split vertical | 2-split vertical | 2-split vertical | 4-split vertical |
| System type | 1 + 1 | 2 + 1 | 2 + 1 | 1 + 1 |
| Power source type | Switching power source | AC power source | Switching power source | Switching power source |
| Frequency | 30 kHz | 20 kHz | 100 kHz and 1 kHz | 40 kHz |
| Applied voltage waveform | Positive/negative inverted rectangular wave | Positive/negative inverted sine wave | Positive/negative inverted rectangular wave | Positive/negative inverted rectangular wave |
| Conveying layout | Carousel rotating system | Carousel rotating system | Carousel rotating system | In-line |
| Rate monitor type | Crystal oscillator | Crystal oscillator | Crystal oscillator | Optical interference |
| Power control feedback | Present | Rate feedback present | Rate feedback present | End point detected |
| Plasma monitor type | Plasma emission intensity detected | Plasma emission intensity detected | Plasma partial pressure detected | Plasma emission intensity detected |
| Monitoring ion | Titanium, oxygen | Titanium, oxygen | Titanium, oxygen | Titanium, oxygen |
| Substrate type | Glass rod lens | Plastic rod lens | Glass fiber sloping end | Plate glass |
| Use | Optical communication | Optical communication | Optical communication | DWDM optical communication filter |

TABLE 1-continued

|  | Example 1 | Example 2 | Example 3 | Example 4 |
|---|---|---|---|---|
| Substrate temperature | Room temperature | 150° C. | 250° C. | 200° C. |
| Target composition | Ti and Si | Ti and Si | Ti and Si | Ti and Si |
| Film material structure | $TiO_2$/ $SiO_2$/ $TiO_2$/ $SiO_2$ | $TiO_2$/ $SiO_2$/ $TiO_2$/ $SiO_2$ | $TiO_2$/ $SiO_2$/ $TiO_2$/ $SiO_2$ | $Ta_2O_5$, $SiO_2$ |
| Film thickness structure (nm) | 65.8/ 52.7/ 224.1/ 259.0 | 65.3/ 51.1/ 224.6/ 257.3 | 65.8/ 52.7/ 224.1/ 259.0 | 2-Cavity, 47-layer |
| Plasma bombardment on film | Strong | Strong | Strong | Strong |
| Target surface destaticizing effect | Present | Present | Present | Present |
| Microarcing phenomenon | Absent | Absent | Absent | Absent |
| Pinholes/ foreign matter | ○ | ○ | ○ | ⊚ |
| Discharge stability (arcing) | ⊚ | ⊚ | ⊚ | ⊚ |
| Adhesive property of film with substrate | ⊚ | ⊚ | ⊚ | ⊚ |
| Film denseness | ⊚ | ⊚ | ⊚ | ⊚ |
| Stability of film thickness control | ○ | ⊚ | ⊚ | ○ |
| Total evaluation | ○ | ⊚ | ○ | ○ |

TABLE 2

|  | Example 5 | Example 6 | Example 7 |
|---|---|---|---|
| Cathode material | 2-split vertical | Concentric circle type | Concentric circle type |
| System type | 1 + 1 | 1 + 1 | 1 + 1 |
| Power source type | Switching power source | Switching power source | Switching power source |
| Frequency | 30 kHz | 30 kHz | 30 kHz |
| Applied voltage waveform | Positive/negative inverted rectangular wave | Positive/negative inverted rectangular wave | Positive/negative inverted rectangular wave |
| Conveying layout | Carousel rotating system | In-line | In-line |
| Rate monitor type | Optical interference effect detecting | Crystal monitor | Crystal oscillator |
| Power control feedback | End point detected | Rate feedback present | Rate feedback present |
| Plasma monitor type | Plasma partial pressure detected | Plasma emission intensity detected | Plasma emission intensity detected |
| Monitoring ion | Titanium, oxygen | Titanium, oxygen | Titanium, oxygen |
| Substrate type | Plastic fiber | Microlens array | Plastic panel |
| Use | Optical communication | Optical communication | Optical filter (edge filter) |
| Substrate temperature | Room temperature | Room temperature | Room temperature |
| Target composition | Ti and Si | Ti and Si | Ti and Si |
| Film material structure | $Ta_2O_5$/ $SiO_2$/ $Ta_2O_3$/ $SiO_2$ | $TiO_2$/ $SiO_2$/ $TiO_2$/ $SiO_2$ | $TiO_2$/ $SiO_2$/ alternate laminate |
| Film thickness structure (nm) | 67.9/ 47.4/ 225.6/ 259.5 | 67.4/ 46.0/ 225.8/ 257.8 | 27-layer structure |

TABLE 2-continued

|  | Example 5 | Example 6 | Example 7 |
| --- | --- | --- | --- |
| Plasma bombardment on film | Strong | Strong | Strong |
| Target surface destaticizing effect | Present | Present | Present |
| Microarcing phenomenon | Absent | Absent | Absent |
| Pinholes/foreign matter | ○ | ◉ | ◉ |
| Discharge stability (arcing) | ◉ | ◉ | ◉ |
| Adhesive property of film with substrate | ◉ | ◉ | ◉ |
| Film denseness | ◉ | ◉ | ◉ |
| Stability of film thickness control | ◉ | ○ | ◉ |
| Total evaluation | ◉ | ○ | ◉ |

TABLE 3

|  | Comparative Example 1 | Comparative Example 2 | Comparative Example 3 | Comparative Example 4 |
| --- | --- | --- | --- | --- |
| Cathode material | Plate 1 system | Plate 1 system | Plate 1 system | Vacuum evaporation |
| System type | 1 + 1 | 1 + 1 | 1 + 1 | 2-hearth |
| Power source type | DC power source | DC power source | DC power source | EB power source |
| Frequency | — | — | — | DC |
| Applied voltage waveform | DC | DC | DC | — |
| Conveying layout | Carousel rotating system | Carousel rotating system | In-line | Dome type |
| Rate monitor type | Crystal oscillator | None | None | Crystal oscillator |
| Power control feedback | Rate feedback present | (No end point) | (No end point) | End point |
| Plasma monitor type | None | None | None | None |
| Monitoring ion | None | None | None | None |
| Substrate type | Glass rod lens | Glass fiber | Plate glass | Rod lens |
| Use | Optical communication | Optical communication | Optical substrate | Optical communication |
| Substrate temperature | Room temperature | Room temperature | Room temperature | Room temperature |
| Target composition | Ti and Si | Ti and Si | Ti and Si | TiOx and $SiO_2$ |
| Film material structure | $TiO_2$/ $SiO_2$/ $TiO_2$/ $SiO_2$ | $TiO_2$/ $SiO_2$/ $TiO_2$/ $SiO_2$ | $TiO_2$/ $SiO_2$/ $TiO_2$/ $SiO_2$ | $TiO_2$/ $SiO_2$/ $TiO_2$/ $SiO_2$ |
| Film thickness structure (nm) | 65.8/ 52.7/ 224.1/ 259.0 | 65.8/ 52.7/ 224.1/ 259.0 | 65.8/ 52.7/ 224.1/ 259.0 | 63.7/ 57.7/ 223.3/ 258.6 |
| Plasma bombardment on film | Weak | Weak | Weak | Weak |
| Target surface destaticizing effect | Absent | Absent | Absent | — |
| Microarcing phenomenon | Present | Present | Present | Absent |
| Pinholes/ foreign matter | x | x | x | ○ |
| Discharge stability (arcing) | Δ | Δ | Δ | ○ |
| Adhesive property of film with substrate | Δ | Δ | Δ | x |
| Film denseness | ○ | ○ | ○ | Δ |

TABLE 3-continued

|  | Comparative Example 1 | Comparative Example 2 | Comparative Example 3 | Comparative Example 4 |
|---|---|---|---|---|
| Stability of film thickness control | ⊚ | Δ | Δ | ○ |
| Total evaluation | x | x | x | x |

The parameters in Tables 1 to 3 were determined by experiment and are described below.

1) Target material arrangement: The combination of the pair of targets 2A, 2B such as shown in the top view of the targets in FIG. 8(a) in which the arrangement is serial in the direction perpendicular to the conveying direction of the substrate 4 and an alternate positive/negative voltage is applied is referred to as a "2-split vertical" arrangement for convenience, and a case in which the arrangement is serial in the direction perpendicular to the conveying direction of the substrate, and the pair of targets 2A, 2B and the pair of targets 2C, 2D to which the alternate positive/negative voltage is applied are arrayed in pairs, such as shown in the top views of the targets in FIG. 8(b), 8(c) is referred to as a "4-split vertical" arrangement for convenience.

Figure 8:
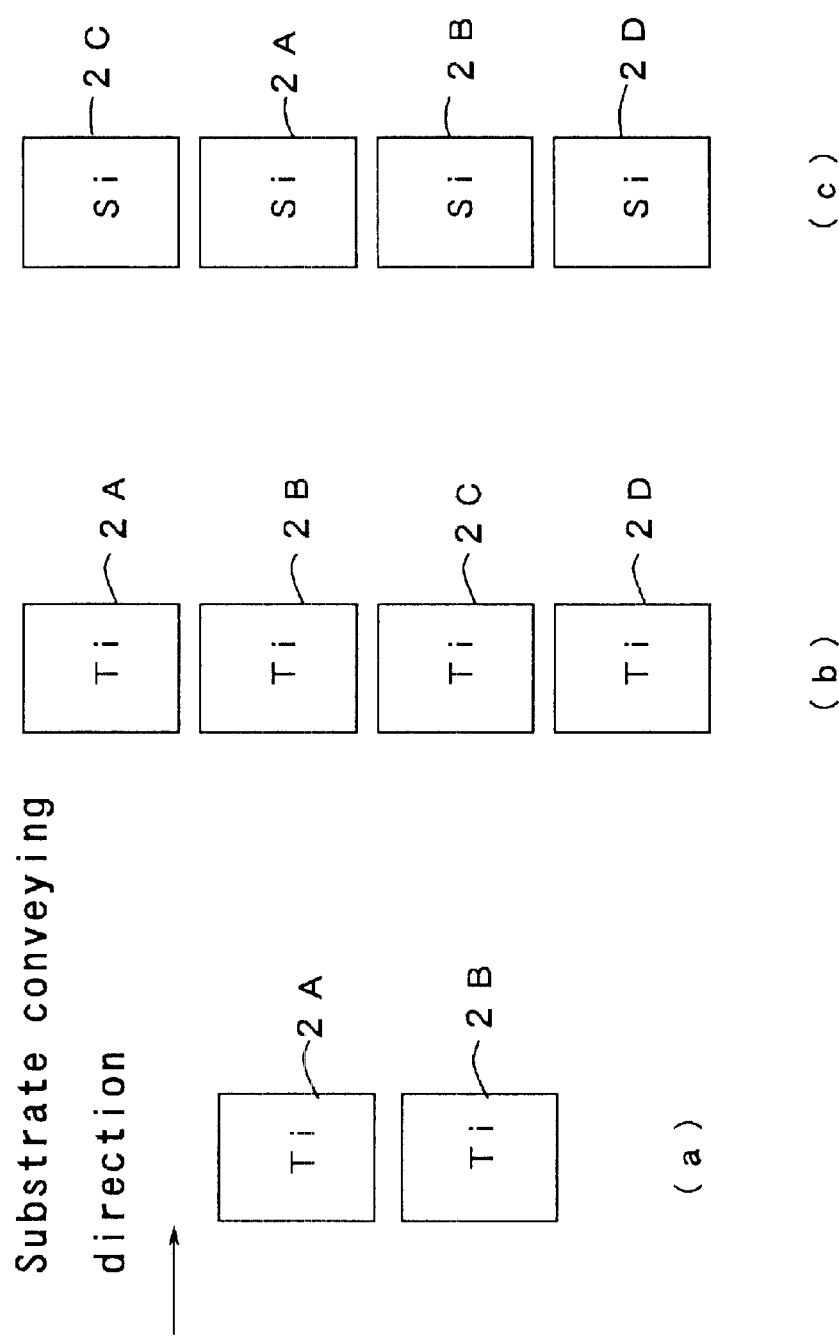
FIGS. 8(a), (b) and (c) are top views of cathodes.

In the case of the "4-split vertical" arrangement, the alternate positive/negative voltage is sometimes applied between the pair of targets 2A, 2B and between the pair of targets 2C, 2D which are adjacent as shown in FIG. 8(b), and the alternate positive/negative voltage is sometimes applied between the pair of targets 2A, 2B in the center and between the pair of targets 2C, 2D at the ends, as shown in FIG. 8(c).

Figure 9:
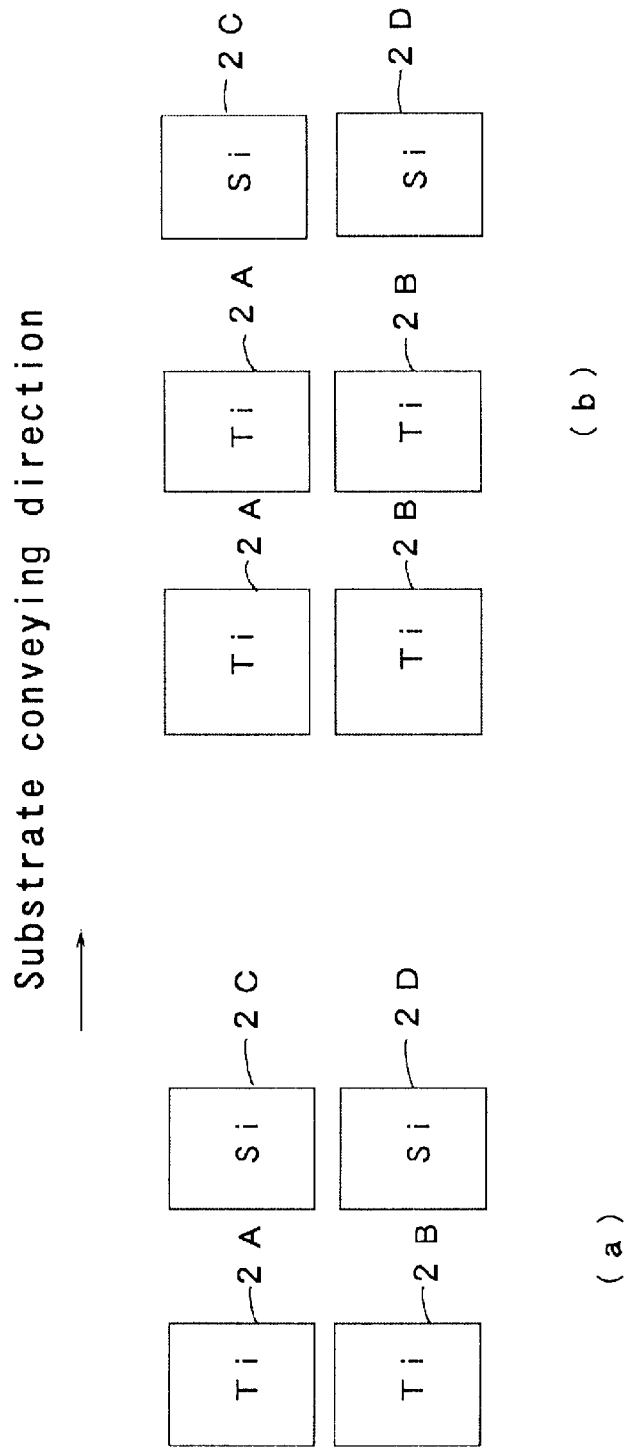
FIGS. 9(a) and (b) are top views of cathodes.

2) System type: The case in which cathodes in the "2-split vertical" arrangement of FIG. 8(a) are arranged with the pair of targets 2A, 2B and the pair of targets 2C, 2D of different types in two rows in the forward/backward direction of the substrate conveying direction, as shown in the top view of the targets in FIG. 9(a), are referred to as a "1+1" system for convenience, and the case in which cathodes in the "2-split vertical" arrangement of FIG. 8(a) are arranged with the pair of targets 2A, 2B of the same type in two rows and the pair of targets 2C, 2D of a different type in one row in the substrate conveying direction, as shown in FIG. 9(b), are referred to as a "2+1" system for convenience. The target arrangement of the "2+1" system is applied when a target material with a low film-forming speed, such as titanium, is used in combination with a target material with a high film-forming speed, such as silicon.

The "2-hearth" of Comparative Example 4 (Table 3) is a case in which Ti and Si were placed in separate crucibles for vacuum evaporation.

Figure 10:
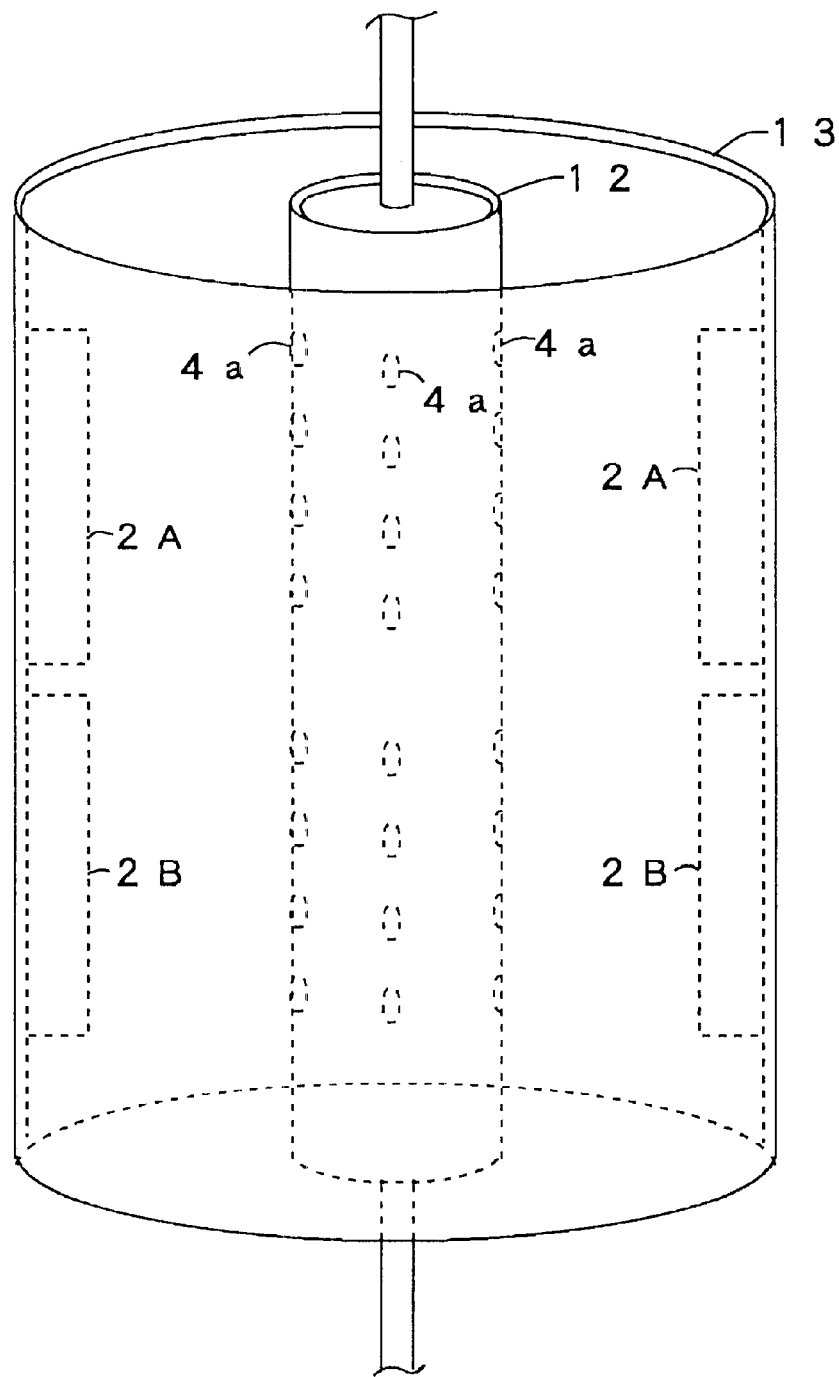
FIG. 10 is a schematic view of a film-forming apparatus with a double-cylinder bell jar (carousel) system.
Figure 11:
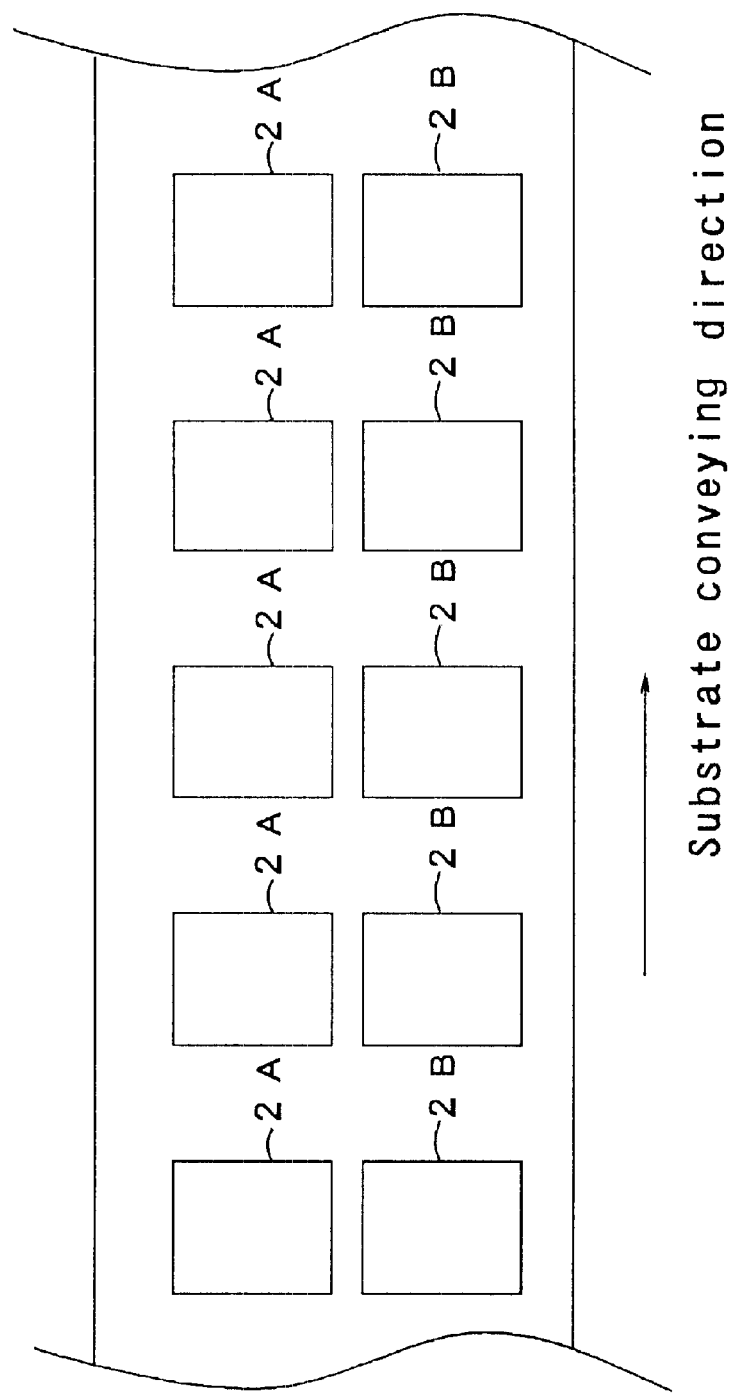
FIG. 11 is a schematic view of a film-forming apparatus with an in-line system.

3) Conveying layout: A system in which the targets 2A, 2B are situated inside the outer cylinder 13 of a double cylinder such as shown in FIG. 10 facing the film-forming surface 4a of the substrate 4 on the outside of the inner cylinder 12 and the outer cylinder 13 and/or inner cylinder 12 are rotated, is referred to as a bell jar (carousel) system, and a system in which the substrate is conveyed linearly, a plurality of the cathodes 1A, 1B of FIG. 12 arranged in a row in the direction perpendicular to that conveying direction and to which a positive/negative voltage is to be alternately applied are arranged in the forward/backward direction of the conveying direction of the substrate 4, and a plurality of rows of targets 2A, 2B are arranged each corresponding to a straight line thereon, such as shown in FIG. 11, is referred to as an in-line system.

4) Rate monitor type: The film-forming rate of the film thickness on the surface of the substrate 4 may be measured using a crystal oscillator based on the change in the vibration frequency due to the size of the adhering film thickness, or it may be measured using an optical interference effect detector based on the change in the optical interference effect due to the size of the coating film thickness.

5) Power control feedback: This refers to film formation carried out while varying the voltage of the voltage and current to adjust the power introduced to the power source (cathode) so that the film-forming speed measured by the rate monitor is constant, in order to stabilize the film thickness coverage of the coating on the surface of the substrate 4. The end point detection refers to detection of the point at which the coating film thickness on the surface of the substrate 4 as measured by the method of 4) above reaches a prescribed point. The film formation ends when detecting the end point.

6) Monitoring ion: The optical intensity and partial pressure of the metal ion or gas ion contributing to the oxygen reaction are monitored to control the stability of the reaction rate of the plasma 3, and the ion type is referred to as the monitoring ion.

7) Substrate type: A glass or plastic lens or fiber, plate glass, or the like was used; the glass fiber sloping end was made by cutting the side of a bar-shaped fiber at a prescribed slope angle with respect to the side and forming a coating on the polished cut surface.

8) Film material structure: For $TiO_2/SiO_2/TiO_2/SiO_2$, first a voltage is applied just to the Ti target without applying voltage to the Si target, to form a $TiO_2$ film, and then a voltage is applied just to the Si target without applying voltage to the Ti target, to form an $SiO_2$ film. This is repeated twice to form the film.

9) Film thickness structure: The "2-Cavity, 47-layer" in Example 4 (Table 1) refers to a structure with two connected films having a structure provided with a cavity L (optical film thickness $\lambda/2$) between alternate layers of a high refractive index substance H (optical film thickness $\lambda/4$) and a low refractive index substance L (optical film thickness $\lambda/4$). For example, in the case of "HLH . . . HLH, 2L (cavity), HLH . . . HLH", two films are connected through a low refractive index layer L. The "27-layer structure" of Example 7 (Table 2) refers to a film with a 27 layer structure, wherein the film materials $SiO_2$, $TiO_2$ are alternately laminated at a film thickness of $\lambda/4$ each.

10) Plasma bombardment on film: The plasma 3 is bombarded on the surface of the substrate 4 to incite movement of the particles during film growth so that the growing film becomes dense. The substrate surface is also cleaned or enhanced.

11) Target surface destaticizing effect: Indicating the effect in which the reversal of potentials facilitates migration of both the positive ions and electrons, and the electrified charge is neutralized thereby.

12) Microarcing phenomenon: This is minute, almost invisible arcing that occurs between the conductive surface and the insulating surface formed by film accumulation, near the target erosion border, and it is a cause of pinholes and generation of foreign matter.

13) Pinholes and foreign matter: Pinholes or foreign matter with a diameter of at least 50 microns in a 100 mm square area; ≦10 is indicated by ⊚, 11–30 by ○, 31–99 by Δ and ≧100 by X.

14) Discharge stability (arcing): Arcing no more than once in one minute was indicated by ⊚, 2–3 times by ○, 4–10 times by Δ and more than 10 times by X.

15) Adhesive property of film with substrate: A coating-formed substrate was exposed to a temperature of 70° C. and humidity of 90% for 24 hours and then abraded with cellulose wiper (BEMCOT™ TASAHIKASEI Co., Ltd.), and the surface condition was observed with a microscope. The presence of clear scratches or peeling was indicated by X, the presence of scratches or peeling to a degree constituting no problem was indicated by ○, and absolutely no scratches or peeling was indicated by ⊚.

16) Film denseness: The coated substrate was immersed in a solution of 50% $HF:61\%$ $HNO_3:H_2O=3:2:60$ (volume ratio) at a temperature of 20° C. for 20 seconds, and the film loss depth of the $SiO_2$ film was measured and a relative comparison was made with respect to the vacuum evaporation film obtained in Comparative Example 4 (Table 3). A film loss depth of less than 10% was indicated by ⊚, 10 to <50% by ○, 50% to <90% by Δ, and 90% or greater by X.

17) Film thickness stability control: The dynamic rate variation and film thickness control properties of the $SiO_2$ were compared at 10 kw·h and 60 kW·h integrated power for negative electrode use.

These examples and comparative examples demonstrate that the embodiments of the invention allow coating of an optical coating on the surface of a substrate by simultaneous reactive sputtering of target materials situated on two cathode surfaces by glow discharge upon application of an alternate positive/negative voltage to the two cathodes. By determining the film thickness based on the optical interference in real time, it is possible to stably form a dense optical film structure. Also, by instantaneously controlling the aperture of the valve provided on the reactive gas supply tube so that the intensity of the plasma emission of the reactive plasma gas is detected while being kept at a given value, it is possible to stably control the reaction rate with the flying metal particles and stabilize the film formation rate and discharge condition. This makes it possible to achieve the optical precision necessary for an optical part.

On the other hand, Comparative Examples 1–4 are examples employing conventional methods that involve sputtering or vacuum evaporation, and the performance of the resulting films are clearly inferior to the films of the invention.

The apparatus may have a bell jar shape to increase the number of optical parts that can be placed in the apparatus at a time, and the space for management of the non-film-formed sections such as optical fibers can be provided inside the bell jar in the invention.

What is claimed is:

1. A film-forming apparatus comprising
    a film-forming substrate conveying device in a vacuum apparatus with an adjustable reduced pressure atmosphere,
    a pair of magnetron sputtering cathodes located proximally to each other and situated in a straight line in the direction perpendicular to the conveying direction of the substrate, with at least one row situated in the conveying direction of the substrate,
    a pair of targets situated on said cathodes, a film-forming substrate positioned opposite said targets, and
    a power source device that alternately reverses the polarity of said pair of cathodes so that when the first of said pair of cathodes is used as a negative electrode the second of said pair of cathodes is used as a positive electrode, and when the second of said pair of cathodes is used as a negative electrode the first of said pair of cathodes is used as a positive electrode, in order to apply a glow discharge-producing voltage to the pair of targets corresponding to each of said pair of cathodes, situated on the surface of each cathode.

2. A film-forming apparatus according to claim 1, characterized in that a magnetron magnet is situated so that the average magnetic force at the border section between the pair of targets located proximally to each other is weaker than at the other sections, and so that the magnetic field at the erosion zones on the targets are equivalent at the sections near the border section and at the other sections.

3. A film-forming apparatus according to claim 1, characterized in that a single continuous magnetic circuit is formed in said pair of targets.

4. A film-forming apparatus according to claim 1, characterized in that the substrate is situated in a rotatable manner at the center of a rotating axis in one longitudinal direction, and including a plurality of rows of target units, in which said pair of targets are situated opposite the surface of said substrate in a row in the longitudinal direction inside a cylinder vessel whose center axis is said rotating axis, and the plurality of rows of target units are arranged in parallel to the circumferential direction of the cylinder.

5. A film-forming method on a substrate being conveyed by sputtering targets on cathodes comprising
    situating a pair of cathodes located proximally to each other in a straight line in the direction perpendicular to the conveying direction of the substrate, with at least one row situated in the conveying direction of the substrate, situating a target on said cathode and a film-forming substrate positioned opposite said target, in a vacuum area that allows adjustment of a reduced pressure atmosphere to form a film on the surface of said substrate, and
    alternately reversing the polarity of said pair of cathodes so that when the first of said pair of cathodes is used as a negative electrode the second of said pair of cathodes is used as a positive electrode, and when the second of said pair of cathodes is used as a negative electrode the first of said pair of cathodes is used as a positive electrode, in order to apply a glow discharge-producing voltage to a pair of targets corresponding to each of said pair of cathodes, situated on the surface of each cathode, and simultaneously sputtering said pair of targets by the produced glow discharge to form a film comprising the structural material of said targets on the surface of said substrate.

6. A film-forming method according to claim 5, characterized in that a magnetron magnet is situated also at the border section between said pair of targets, the magnetic field is corrected at said border section so that, from the viewpoint of only the magnetic field from the first target to the second target of the pair of targets, the average magnetic force at said border section is weaker than at the sections other than said border section, and so that the magnetic field at the erosion zones formed after adjacently situating the pair of targets are equivalent at the sections near the border section and at the other sections, and the difference in the film thickness between one area and another of the substrate in the direction perpendicular to the conveying direction of the substrate obtained by the process of sputtering the entirety of said pair of targets is within a range of about ±20% in the main film-forming region.

7. A film-forming method on a substrate being conveyed by sputtering targets on cathodes to claim 5, characterized in that a single continuous magnetic circuit is formed in said pair of targets, and the difference in the film thickness of the substrate in the direction perpendicular to the conveying direction of the substrate obtained by the process of sputtering the entirety of said pair of targets is within a range of about ±20% in the main film-forming region.

* * * * *